United States Patent [19]

Yonezawa et al.

[11] 3,877,948

[45] Apr. 15, 1975

[54] PHOTOSENSITIVE PRINTING COMPOSITION

[75] Inventors: Teruhiko Yonezawa; Masaru Watanabe, both of Kanagawa, Japan

[73] Assignee: Fuji Photo Film Co., Ltd., Kanagawa, Japan

[22] Filed: Aug. 29, 1972

[21] Appl. No.: 284,517

[30] Foreign Application Priority Data

Sept. 2, 1971 Japan .............................. 46-67711

[52] U.S. Cl. ............................ 96/93; 96/33; 96/75; 96/91 R; 96/86 P; 96/115 R

[51] Int. Cl. ......... G03f 7/04; G03f 7/08; G03f 7/10

[58] Field of Search ....... 96/75, 91 R, 93, 33, 115 R

[56] References Cited

UNITED STATES PATENTS

| | | | |
|---|---|---|---|
| 2,937,085 | 5/1960 | Seven et al. | 96/93 X |
| 2,990,281 | 6/1961 | Printy et al. | 96/93 X |
| 3,285,742 | 11/1966 | Wagner | 96/33 |
| 3,396,019 | 8/1968 | Uhlig | 96/75 X |
| 3,495,979 | 2/1970 | Laridon et al. | 96/75 X |
| 3,516,830 | 6/1970 | Whiteley | 96/114 X |
| 3,595,656 | 7/1971 | Ruckert et al. | 96/75 |
| 3,615,532 | 10/1971 | Silver | 96/93 |
| 3,660,097 | 5/1972 | Mainthia | 96/75 |
| 3,661,573 | 5/1972 | Laridon et al. | 96/75 |
| 3,740,224 | 6/1973 | Barzynski et al. | 96/33 |

FOREIGN PATENTS OR APPLICATIONS

| | | | |
|---|---|---|---|
| 769,670 | 10/1967 | Canada | 96/91 D |
| 1,243,963 | 8/1971 | United Kingdom | 96/91 D |

OTHER PUBLICATIONS

Kosar, J., "Light-Sensitive Systems," Wiley and Sons, 1965, p. 175–180.

*Primary Examiner*—Charles L. Bowers, Jr.
*Attorney, Agent, or Firm*—Sughrue, Rothwell, Mion, Zinn & Macpeak

[57] ABSTRACT

A photosensitive printing material comprising a (1) water soluble alkylene oxide polymer, (2) a polycarboxylic acid or polycarboxylic acid salt capable of forming a water insoluble associate with said olefin oxide polymer and (3) photosensitizing agent is disclosed.

5 Claims, No Drawings

PHOTOSENSITIVE PRINTING COMPOSITION

BACKGROUND OF THE INVENTION

1. Field of the Invention

This invention relates to a photosensitive printing material of a new composition and more particularly to an improved lithographic printing material which can be used for printing directly after exposure resulting in no public pollution (because a development is not required) and which can provide printed matter of a high quality.

2. Description of the Prior Art

The general printing systems are classified presently into three types, i.e., relief plates, intaglio plates and lithographic plates. A relief plate has a projecting surface as an image area and the intaglio plate conversely a recessed surface as an image area. In these plates, the image area is distinguished from the non-image area by the difference in the height of the plate surface. To the contrary, in the lithographic plate, both the image and the non-image area are approximately in the same plane and distinguished in principle by a difference in their repellency between water and oil. Therefore, it is necessary in a lithographic plate to form a hydrophobic oil-receptive image area and a hydrophilic non-image area.

In the previous typical type of sensitive lithographic plate, the surface of a plate of zinc, aluminum, magnesium etc., is rendered hydrophilic. Namely, a metal plate is provided with a hydrophilic surface by a suitable treatment such as a mechanical graining treatment of the metal surface, a chemical treatment, e.g., cronak treatment or an anode oxidation in an acid solution, e.g., sulfuric acid, oxalic acid, chromic acid or phosphoric acid, a thin layer of a photo-setting resin such as a bichromate colloid, a diazo resin and the like is coated on the surface as a support to form a photosensitive layer, the photosensitive layer is irradiated through a negative to be printed with an active ray and the image area is rendered insoluble in a liquid developer and oil receptive by the photo-setting reaction. The photosensitive layer, which has been covered with the negative, is unexposed and is unreacted, is removed using a suitable liquid developer to expose a hydrophilic support surface as a non-image area.

In the above process, the step for removing the unphotoreacted portion (the non-image area portion) of the photosensitive layer, i.e., the development step, as well as a washing step which follows are necessary. Further, it is necessary to coat the hydrophilic support surface as a non-image area with gum arabic, etc., in order to prevent a reduction in the hydrophilic property of the surface due to the effects of air. Therefore, additional time is required after the exposure in order to obtain a lithographic plate, and work equipment such as cleaning and washing equipment are necessary. Moreover, the discharge of the liquid developer and the solution of unreacted sensitive material resulting from the developing and washing may provide the danger of public pollution.

As described above, previous lithographic printing materials have many processing problems after exposure.

Accordingly, the unexposed area of photosensitive layer provided on a support maintains its hydrophilic property (it acts as it is as the non-image area), and on the other hand, the exposed area is rendered hydrophobic (oil-receptive) and a photosensitive lithographic printing material which can be used directly after exposure is obtained.

As a lithographic printing plate in which the unexposed area of the photosensitive layer is used as the non-image area as it is, there is now one known as collotype, in which a photosensitive gelatin is coated on a support (in general, a glass plate is used), the gelatin is hardened gradually due to the effect of light and displays an oil-receptive property corresponding to the amount of light, although it is initially hydrophilic. Therefore, it is not necessary to remove the unexposed area using a development step. However, there are great disadvantages with collotype; i.e., it has poor durability as a printing plate, a large degree of skill and a long time in making a printing plate is required, and a specific printing machine should be used for printing.

Additionally, while a photosensitive composition of an ethylene oxide polymer and a heat-fusible phenol resin as the main components has been found, the low hydrophilic property of this composition disadvantageously provides a large amount of soiled nonimage area according to our test results.

Therefore, an object of this invention is to provide a photosensitive printing material having a new composition in which the disadvantages as described above are overcome (especially, a material which is excellent in its hydrophilic property and provides printed matter of good quality).

SUMMARY OF THE INVENTION

The object of this invention is accomplished with a photosensitive printing material comprising (1) a water soluble alkylene oxide polymer, (2) a polycarboxylic acid or a polycarboxylic acid salt capable of forming a water insoluble associate with the alkylene oxide polymer and (3) a photosensitizing agent.

DETAILED DESCRIPTION OF THE INVENTION

The alkylene oxide polymer which is suitable in this invention has a mean molecular weight ranging from about 100,000 to 10,000,000 and is selected in general from water soluble resinous solid alkylene oxides. The most preferred alkylene oxide is polyethylene oxide having the repeating unit $\text{-(}CH_2\text{—}CH_2\text{—}O\text{)-}$ because of its water solubility. In addition to polymers having single repeating units $\text{-(}(CH_2\text{—}CH_2)_n\text{—}O\text{)-}$, the alkylene oxide polymer according to this invention includes copolymers of different olefin oxides. As the latter copolymers, there are described, for example, copolymers of ethylene oxide with propylene oxide or butylene oxide, etc.

The polycarboxylic acid or polycarboxylic acid salt according to this invention is one which can form a water insoluble associate with the alkylene oxide polymer (this phenomenon of insoluble association is well understood by those skilled in the art). For example, there are described styrene-maleic acid copolymers, ethylene-maleic acid copolymers, polyacrylic acid (or its alkali metal salt); the acid esters of polycarboxylic acids with polyvinyl alcohol containing free carboxylic acid groups or carboxylic acid alkali metal salt groups in the side chain portion thereof, such as polyvinyl hydrogen phthalate, polyvinyl hydrogen maleate, polyvinyl naphthoate carboxylic acid and the like. Further, the acid esters of polycarboxylic acids with polyvinyl alcohol may contain hydroxyl groups which are not esterified or esterified with other carboxylic acids, or hydroxy groups in the form of acetal without providing any difficulties in the operation of this invention.

The photosensitizing agent according to this invention is one which reacts with the polycarboxylic acid component due to the effect of optical energy to accomplish the so-called "photohardening" of the polycarboxylic acid (or its salt), or the photosensitizing agent itself may be polymerized and hardened (the term "photosensitizing agent" is also well known and is generally used in the art). Such photosensitizing agents include diazo compounds such as condensates of diphenylamine diazonium salt with formaldehyde; hexavalent chromium compounds such as potassium or ammonium bichromate; and alkyl halides such as iodoform and bromoform. Unsaturated monomers having more than two double bonds which can be addition polymerized (for example, methylene bisacrylic amide, ethylene bisacrylic amid, methylene bismethacrylic amide, triethyleneglycol diacrylate, triacrylformal, diallylphthalate etc.) used with a photopolymerization initiator (for example, benzophenone, benzoine methylate) (see British Pat. Nos. 1,154,872 and 1,148,328) do not give good results so that they are not included in the photosensitizing agent according to this invention.

In this invention, the photosensitizing agent may be coated on a support as a single photosensitive composition in conjunction with the other two components or coated as a suitable solution on a coated film of the other two components.

Suitable ratios of each component according to this invention are from 0.2 to 5 parts, preferably from 0.4 to 2 parts, by weight of alkylene oxide polymer for each part by weight of the polycarboxylic acid (or its salt), and from 0.02 to 0.5 parts, preferably from 0.1 to 0.3 parts, by weight of photosensitizing agent for each part by weight of polycarboxylic acid-alkylene oxide polymer mixture.

The lithographic printing material according to this invention can be manufactured by coating the photosensitive composition according to this invention dissolved in a suitable solvent on a sheet support having a cleaned surface and drying the same. A coating having a thickness greater than 1 micron is preferred. Suitable solvents include alcohols such as methanol, ethanol, propanol, isopropanol and the like, ketones such as acetone methyl ethyl ketone and the like, benzene, dimethylformamide, tetrahydrofuran, ethylene chloride, etc. Suitable supports include metal plates such as aluminum, zinc, steel, copper and the like, plastic plates such as cellulose triacetate, cellulose diacetate, polyethylene terephthalate, polyethylene, polystyrene, polycarbonate and the like, paper or laminates of paper and a resin such as polyethylene, polypropylene and the like. It is also possible to cast the solution and dry it to yield a sheet of the composition itself. It can be manufactured by mixing the composition in the presence of a small amount of solvent and removing it as a sheet.

Even if a support is used, many of the critical requirements in the previous lithographic printing materials are not necessary in this invention. Namely, since the non-image area is formed on the surface of a support in the prior known lithographic printing materials, the photosensitive layer is formed on a zinc or aluminum plate subjected to a sufficient degree of hydrophilicity or a paper or plastic support, the surface of which is rendered hydrophilic. However, in this invention, the composition itself is used as the non-image area so that the requirements other than water resistance are not severe resulting in the ability to select the support material from a very large number of varieties.

The lithographic printing material according to this invention has very large advantages. That is, (1) no operation other than exposure in making the printing plate is required and the desired printed matter can be obtained within a very short time; (2) the space for cleaning and washing which is necessary in the previous procedure for making a printing plate can be eliminated; (3) the hydrophilic property of the photosensitive composition according to this invention is reduced corresponding to the degree of photohardening due to the nature of the composition, in other words, the oil-receptive property of the composition is increased with the degree of photohardening so that reproduction in which previously the gradiation is produced by a change of the half-tone dots can be printed in an equivalent gradiation using a negative having a continuous gradiation; and (4) the non-image area is soiled very little in printing.

This invention will be illustrated more fully by reference to the following examples but the invention is not intended to be restricted thereto in any way. Unless otherwise indicated all percents and parts are by weight.

EXAMPLE 1

2.7 g of an ethylene oxide polymer (having a molecular weight of about 1,000,000 – 1,500,000) and 5.3 g of polyvinyl hydrogen phthalate (available from Eastman Organic Chemicals) were dissolved in 100 g of dimethylformamide to yield a viscous solution, to which 200 g of methyl alcohol were added with stirring well. A cleaned aluminum foil, which was dipped in a 3% aqueous solution of sodium tertiary phosphate at 70°C for 1 min, washed well and dried, was coated with the above described solution using a rotary coating machine and dried at 80°C for 5 min. The resulting coated layer was coated with a 3% aqueous solution of diphenylamine diazonium salt and formaldehyde condensate (1:1 in molar ratio) and then dried with hot air at 80°C for 2 min. A half-tone negative was placed on the resulting plate and exposed for 3 min to a 30 A carbon arc lamp at a distance of 50 cm. When the exposed plate was set in a Multilith 1250 off-set printing machine and used for printing in a conventional manner, printed matter of excellent sharpness were obtained while the unexposed area remained clean as it was and only the exposed area was applied with ink.

EXAMPLE 2

3.5 g of polyethylene oxide (molecular weight: about 1,000,000 – 1,500,000) and 4.5 g of polyvinyl hydrogen phthalate were dissolved in 100 g of dimethylformamide, 200 g of ethylene dichloride and 200 g of methyl alcohol, 1.0 g of iodoform was added thereto and stirred well to yield a homogeneous solution. A cleaned aluminum foil similar to that of Example 1 was coated with the solution using a rotary coating machine and dried at 80°C for 5 min. A half-tone negative was placed on the resulting plate and exposed for 5 min to a 30 A carbon arc lamp at a distance of 50 cm. The resulting plate was used for printing in a Multilith 1250 printing machine to yield printed matter of excellent quality.

EXAMPLE 3

3.0 g of polyethylene oxide (molecular weight: about 500,000–3,000,000) and 5.0 g of styrene-maleic acid copolymer (6:3 in molar ratio) were dissolved in 100 g of dimethylformamide, 200 g of ethylene dichloride and 200 g of methyl alcohol were added thereto and stirred well to yield a homogenous soluton. A matted surface of polyethylene terephthalate support was coated with the solution and dried at 80°C for 5 min. The plate was provided with the photosensitivity using the diazo condensate as described in Example 1, and a negative film of continuous gradiation was placed thereon and exposed to light. The resulting plate was set in a printing machine and used for printing in a conventional manner to yield printed matter having excellent quality.

While the invention has been described in detail and in terms of specific embodiments thereof, it will be apparent to one skilled in the art that various changes and modifications can be made therein without departing from the spirit and scope thereof.

What is claimed is:

1. A photosensitive printing composition consisting essentially of a (1) water soluble alkylene oxide polymer having a molecular weight ranging from about 100,000 to 10,000,000, (2) a polycarboxylic acid or polycarboxylic acid salt forming a water insoluble associate with said alkylene oxide polymer and (3) a photosensitizing agent selected from the group consisting of a diazo compound, a bichromate salt and an alkyl halide.

2. The photosensitive printing composition of claim 1, wherein the amount of said alkylene oxide polymer ranges from 0.2 to 5 parts by weight for each part by weight of said polycarboxylic acid or polycarboxylic acid salt and wherein said photosensitizing agent ranges from 0.02 to 0.5 parts by weight for each part by weight of said alkylene oxide polymer and said polycarboxylic acid or said polycarboxylic acid salt.

3. The photosensitive printing composition of claim 1, wherein said alkylene oxide is ethylene oxide, or a mixture of ethylene oxide with propylene oxide or butylene oxide.

4. The photosensitive printing composition of claim 1, wherein said polycarboxylic acid is styrene-maleic acid copolymer, ethylene maleic acid copolymers, polyacrylic acid, polyvinyl hydrogen phthalate, polyvinyl hydrogen maleate, or polyvinyl naphthoate carboxylic acid.

5. The photosensitive printing composition of claim 1, wherein said photosensitizing agent is diphenylamine diazonium salt-formaldehyde condensate, potassium bichromate, ammonium bichromate, iodoform or bromoform.

* * * * *